US012805320B2

(12) United States Patent
Pessl

(10) Patent No.: US 12,805,320 B2
(45) Date of Patent: Nov. 17, 2026

(54) SEMICONDUCTOR MODULE ASSEMBLY AND METHOD FOR PRODUCING A SEMICONDUCTOR MODULE ASSEMBLY

(71) Applicant: MAGNA Powertrain GmbH & Co KG, Lannach (AT)

(72) Inventor: Benjamin Pessl, Linz (AT)

(73) Assignee: MAGNA Powertrain GmbH & Co KG, Lannach (AT)

( * ) Notice: Subject to any disclaimer, the term of this patent is extended or adjusted under 35 U.S.C. 154(b) by 371 days.

(21) Appl. No.: 18/563,012

(22) PCT Filed: Apr. 25, 2022

(86) PCT No.: PCT/EP2022/060900
§ 371 (c)(1),
(2) Date: Nov. 21, 2023

(87) PCT Pub. No.: WO2022/248132
PCT Pub. Date: Dec. 1, 2022

(65) Prior Publication Data

US 2024/0371727 A1 Nov. 7, 2024

(30) Foreign Application Priority Data

May 28, 2021 (DE) ..................... 10 2021 205 476.5

(51) Int. Cl.
*H01L 23/473* (2006.01)
*H01L 23/31* (2006.01)
(Continued)

(52) U.S. Cl.
CPC ......... *H10W 40/47* (2026.01); *H10W 74/127* (2026.01)

(58) Field of Classification Search
CPC ........................... H10W 40/47; H10W 74/127; H01L 23/4334; H01L 23/3672; H01L 23/473
See application file for complete search history.

(56) References Cited

U.S. PATENT DOCUMENTS 9,449,895 B2 * 9/2016 Yoo ....................... H10W 40/30
9,723,764 B2 * 8/2017 Sugita ................ H05K 7/20927
(Continued)

FOREIGN PATENT DOCUMENTS

CN 105590930 A 5/2016
CN 106711109 A 5/2017
(Continued)

OTHER PUBLICATIONS

Xie Yanjun, "Power module", May 24, 2017, Entire Document (Translation of CN 106711109) (of record, cited in the IDS, including Original Document). (Year: 2017).*
(Continued)

*Primary Examiner* — Stephen S Sul
(74) *Attorney, Agent, or Firm* — Dickinson Wright PLLC

(57) ABSTRACT

A semiconductor module assembly includes a semiconductor module having at least one semiconductor chip, which is encapsulated in a substantially rectangular form by a molding compound; and at least one cooling rib structure, which is firmly connected at the top face and/or bottom face of the semiconductor module to a cooling plate in the molding compound. A first housing part surrounds the cooling rib structure and is connected to the semiconductor module in the region of a rib, and open on a first end face and a second end face opposite the first end face, thereby providing access for coolant to the cooling rib structure. A sealing element is disposed between the first housing part and the rib. Two second housing parts, each having a coolant inlet and/or a coolant outlet, are connected at the first end face and second end face to the first housing part.

19 Claims, 17 Drawing Sheets

(51) Int. Cl.
*H10W 40/47* (2026.01)
*H10W 74/10* (2026.01)

(56) References Cited

U.S. PATENT DOCUMENTS 9,941,187 B2 * 4/2018 Yoshida ................ H02M 7/003
10,665,525 B2 * 5/2020 Teysseyre ............. H10W 40/22
11,664,296 B2 * 5/2023 Matsuzawa ........... H01L 23/473 257/718
2006/0096299 A1 * 5/2006 Mamitsu ............... H04L 25/117 257/E23.098
2011/0316143 A1 * 12/2011 Noritake ............... H10W 40/00 257/713
2016/0104654 A1 * 4/2016 Ushijima ............ H01L 23/4093 257/718
2016/0178282 A1 * 6/2016 Bergmann ......... H05K 7/20163 165/169
2016/0247743 A1 * 8/2016 Kadoguchi ........... H10W 40/22
2017/0105320 A1 4/2017 Park
2017/0341638 A1 * 11/2017 Sawada .................. H05K 7/209
2018/0082925 A1 * 3/2018 Grassmann ........... H01L 23/473
2019/0096784 A1 * 3/2019 Katayama ........... H01L 23/3737
2020/0161256 A1 * 5/2020 Kaneko ............... H01L 23/3121
2021/0335693 A1 * 10/2021 Yamada ................ H01L 23/473

FOREIGN PATENT DOCUMENTS

DE 102014106127 A1 11/2014
DE 102014106134 A1 11/2014
DE 102017103230 A1 8/2017
DE 102016117843 A1 3/2018

OTHER PUBLICATIONS

European Patent Office, Rijswijk, Netherlands, International Search Report of International Application No. PCT/EP2022/060900, Mailed Oct. 20, 2022, 2 pages.

* cited by examiner

SEMICONDUCTOR MODULE ASSEMBLY AND METHOD FOR PRODUCING A SEMICONDUCTOR MODULE ASSEMBLY

CROSS-REFERENCE TO RELATED APPLICATIONS

This application is a National Stage of International Application No. PCT/EP2022/060900, filed Apr. 25, 2022, which claims priority to DE 10 2021 205 476.5, filed May 28, 2021. The entire disclosures of each of the above applications are incorporated herein by reference.

FIELD

The present invention relates to a semiconductor module assembly comprising at least one semiconductor module having a semiconductor chip, which is encapsulated substantially parallelepipedally by a molding compound, and a cooling structure for cooling the semiconductor module, and also a method for producing a semiconductor module assembly.

BACKGROUND

This section provides information related to the present disclosure which is not necessarily prior art.

The integration of adequately cooled semiconductor module assemblies in an electronic component, such as an inverter, for example, often proves to be relatively complex and cost-intensive. This is due to the number of or the need for the required, often different, component parts and also numerous manufacturing and rework steps. Moreover, in many integration solutions there is the problem that the coolant flow is inhibited by necessary transverse structures between the semiconductor modules, which results in a deterioration of the cooling capacity and an increase in the pressure loss.

SUMMARY

This section provides a general summary of the disclosure, and is not a comprehensive disclosure of its full scope or all of its features.

It is an object of the invention to specify an improved semiconductor module assembly which is distinguished in particular by its simple and also cost-reduced construction and optimized cooling.

This need can be met by the subject matter of the present invention as claimed. Advantageous embodiments of the present invention are described throughout the present disclosure and claims.

The semiconductor module assembly according to the invention comprises at least one semiconductor module having at least one semiconductor chip, which is encapsulated substantially parallelepipedally by a molding compound and has a plurality of electrical terminals electrically connected to the semiconductor chip, the electrical terminals projecting from the molding compound, a rib running peripherally along the end faces of the semiconductor module, said rib being formed by the molding compound, at least one cooling plate on at least the top face and/or bottom face of the semiconductor module, the cooling plate being enclosed by molding in the molding compound, but at least partly not being covered by the latter, at least one cooling rib structure fixedly connected to the cooling plate on the top face and/or bottom face of the semiconductor module, at least one first housing part, the first housing part being formed and arranged on the semiconductor module in such a way that it surrounds the cooling rib structure and is connected to the semiconductor module in the region of the rib, the first housing part being embodied as open on a first end face and a second end face opposite the first end face and thus allowing access for coolant to the cooling rib structure, a sealing element, the sealing element being arranged between the first housing part and the rib, and two second housing parts each having a coolant inlet and/or a coolant outlet, one second housing part being connected to the first housing part on the first end face and the further second housing part being connected to the first housing part on the second end face.

The end faces of the semiconductor module should be understood to mean the end surfaces of the semiconductor module which are formed in each case laterally extending between the top face and the bottom face of the semiconductor module. The semiconductor module has four end faces, namely a first end face, a second end face, a third end face and a fourth end face.

In this context, a rib running peripherally along the end faces of the semiconductor module should be understood to mean a rib running completely, i.e. over the complete periphery of the semiconductor module formed by way of the end faces.

The cooling plate is preferably manufactured from a metallic material, namely preferably from copper. The cooling plate manufactured from copper can be at least partly coated with nickel.

The first housing part is preferably manufactured as a strand-cast part.

In one advantageous embodiment variant of the present invention, the cooling plate extends from the top face and/or bottom face of the semiconductor module as far as the rib on the end faces of the semiconductor module.

By way of the design of the semiconductor module assembly according to the invention, it is possible to produce efficient (double-sided) cooling for a semiconductor module using fewer individual components. The semiconductor module assembly can furthermore be constructed in a compact and cost-optimized manner.

In one preferred embodiment variant, the semiconductor module assembly has at least two first housing parts, an upper first housing part being arranged on the top face of the semiconductor module and a lower first housing part being arranged on the bottom face of the semiconductor module, the upper first housing part and the lower first housing part being fixedly connected via at least one connection element in the region of at least one end face of the semiconductor module.

The connection element is preferably manufactured from a metallic material and formed in strip-shaped fashion.

A method for producing a semiconductor module assembly having a metallic connection element comprises at least the following steps:

- positioning the semiconductor module assembly without mounted second housing parts in a suitable device,
- applying a prestressing force to the semiconductor module assembly in the direction of the top face and/or the bottom face of the semiconductor module,
- positioning at least one connection element in the region of at least one end face so that the connection element bears partly against the upper first housing part and partly against the lower first housing part, cohesively connecting the connection element to the upper first housing part and to the lower first housing part, releasing the prestressing force.

Preferably, cohesively connecting the connection element to the upper first housing part and to the lower first housing part is effected by way of laser welding.

By virtue of the fixed connection of the connection element to the upper first housing part and the lower first housing part, it is possible to obtain a prestress (minus a portion resulting from springback & settlement) permanently in the semiconductor module assembly—there is no need for any additional screw fittings or similar securing mechanisms for prestressing purposes. As a result, particularly efficient, installation-space-optimized and also robust sealing of the cooling system for cooling the semiconductor module or the semiconductor modules is achieved in a simple manner.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations and are not intended to limit the scope of the present disclosure. In the drawings.

DETAILED DESCRIPTION OF THE INVENTION

FIG. 1 to FIG. 4 each illustrate at least one semiconductor module 2 with a cooling rib structure 6 in different views and degrees of detail. FIG. 5 to FIG. 10 each show a semiconductor module assembly 1 in different views and degrees of detail.

Figure 1:
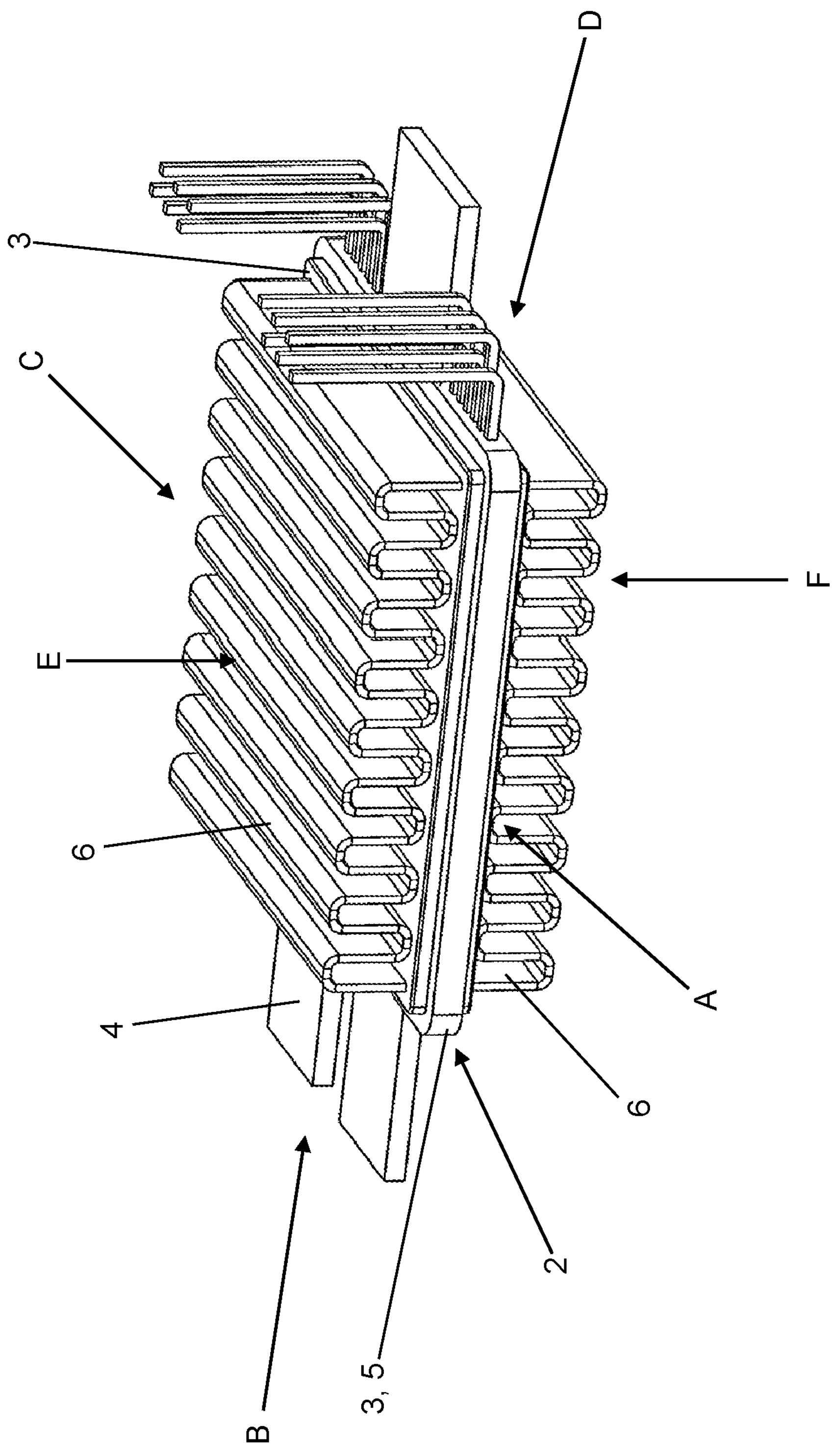
FIG. 1 shows a first perspective view of a semiconductor module with a cooling rib structure.
Figure 2:
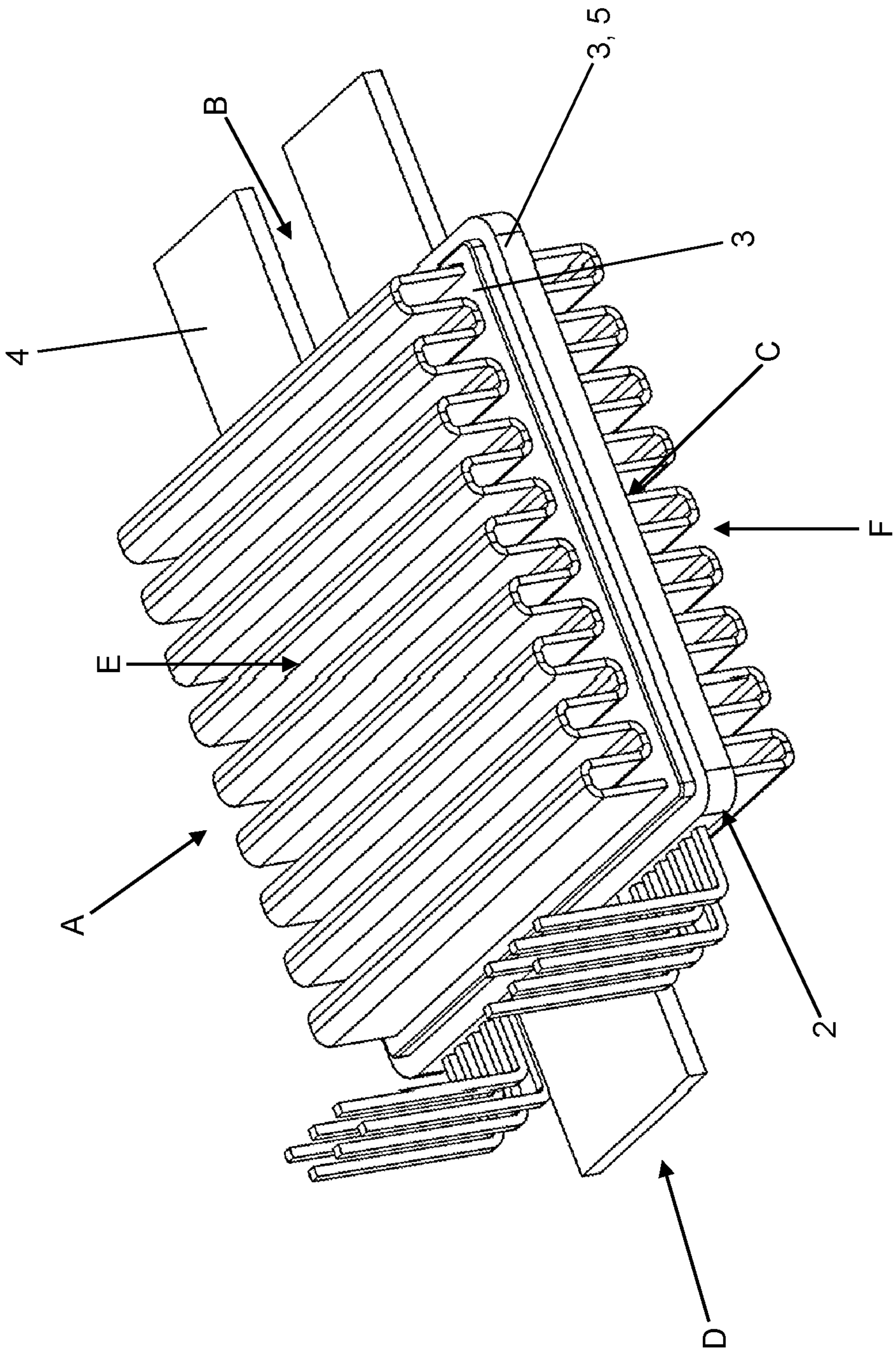
FIG. 2 shows a second perspective view of a semiconductor module with a cooling rib structure.
Figure 3:
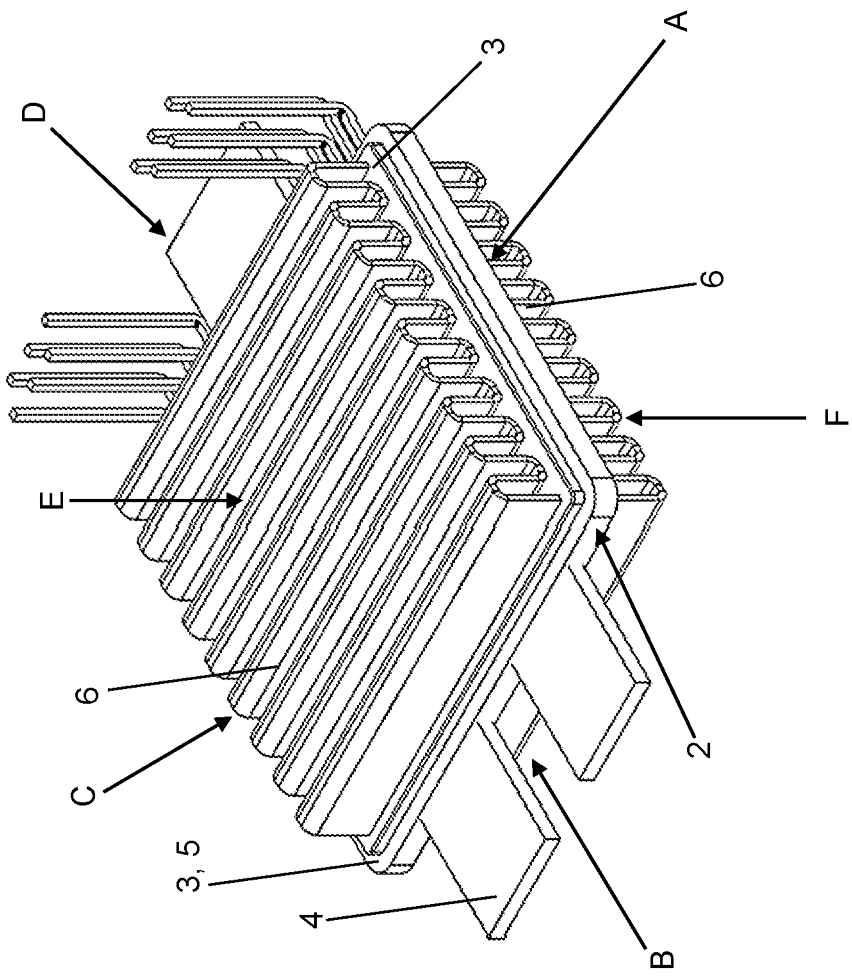
FIG. 3 shows a third perspective view of a semiconductor module with a cooling rib structure.
Figure 4:
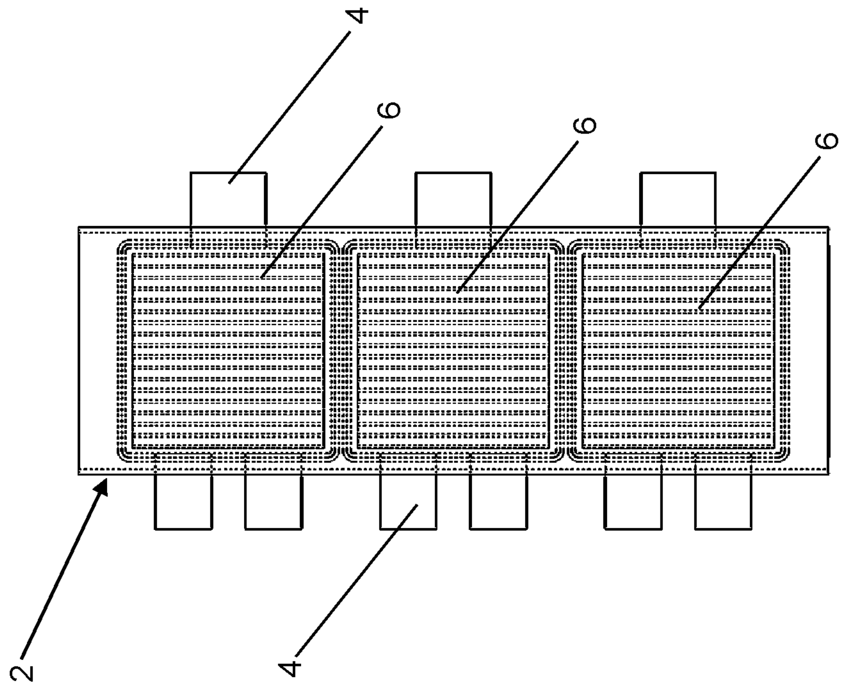
FIG. 4 shows a plan view of three semiconductor modules arranged in succession.

A semiconductor module 2 comprises a semiconductor chip, which is encapsulated substantially parallelepipedally by a molding compound 3. Furthermore, the semiconductor module 2 has a plurality of electrical terminals 4 electrically connected to the semiconductor chip, the electrical terminals 4 projecting from the molding compound 3 (FIG. 1, FIG. 2, FIG. 3).

A peripherally running rib 5 is formed by the molding compound 3 along the end faces A, B, C, D of the semiconductor module 2.

The end faces A, B, C, D of the semiconductor module 2 should be understood to mean the end surfaces of the semiconductor module 2 which are formed in each case laterally between a top face E and a bottom face F of the semiconductor module 2. The semiconductor module 2 has four end faces, namely a first end face A, a second end face B, a third end face C and a fourth end face D.

In this context, a rib 5 running peripherally along the end faces A, B, C, D of the semiconductor module 2 should be understood to mean a rib 5 running completely, i.e. over the complete periphery of the semiconductor module formed by way of the end faces A, B, C, D.

Figure 7:
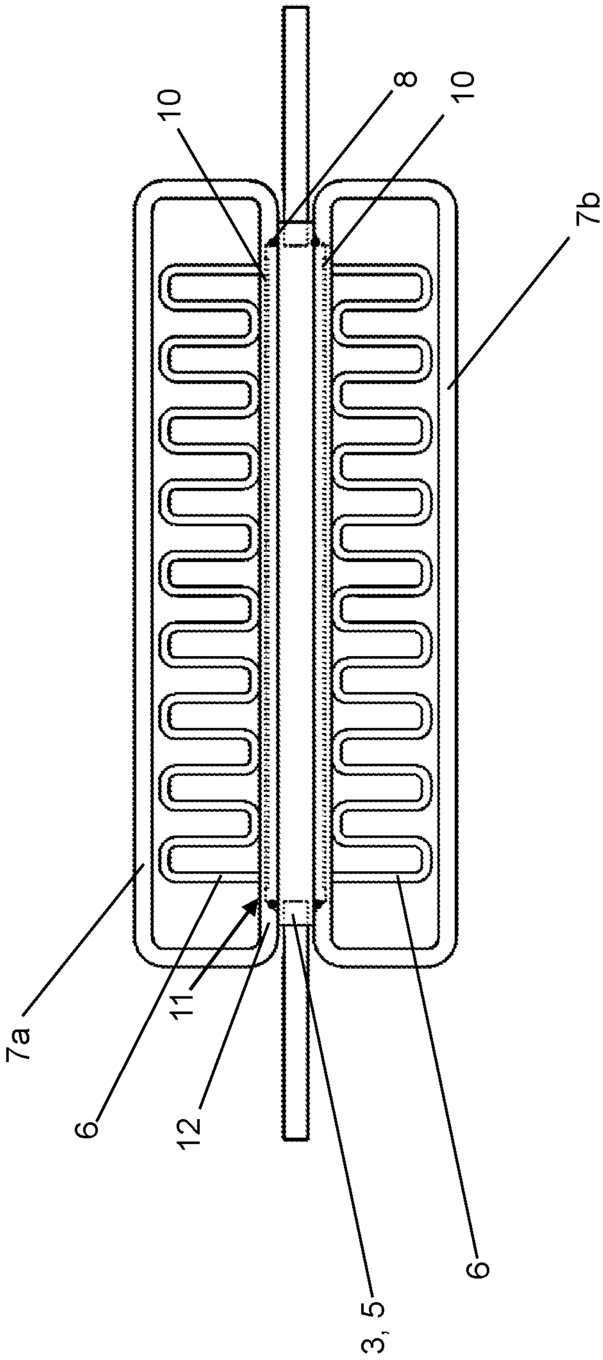
FIG. 7 shows a front view of a semiconductor module assembly without a second housing part.

On the top face E and on the bottom face F of the semiconductor module 2, a respective cooling plate 10 is enclosed by molding in the molding compound 3. The respective cooling plate 10 extends from the top face E and the bottom face F of the semiconductor module 2 as far as the rib 5 on the end faces A, B, C, D of the semiconductor module 2 (FIG. 7). The cooling plate 10 is produced from nickel-coated copper.

In the region of the top face E and the bottom face F of the semiconductor model 2, a respective cooling rib structure 6 is fixedly connected to the cooling plate 10 (FIG. 1, FIG. 2, FIG. 3, FIG. 4). In the present exemplary embodiment, the semiconductor module 2 is thus afforded double-sided cooling. The cooling rib structure 6 is soldered onto the cooling plate 10 in the exemplary embodiment illustrated. However, any other known connection method that results in a fixed connection between the cooling rib structure 6 and the cooling plate 10 is also conceivable.

The semiconductor module assembly 1 illustrated in FIG. 5 to FIG. 10 has three semiconductor modules 2 according to FIG. 1 to FIG. 3.

Figure 8:
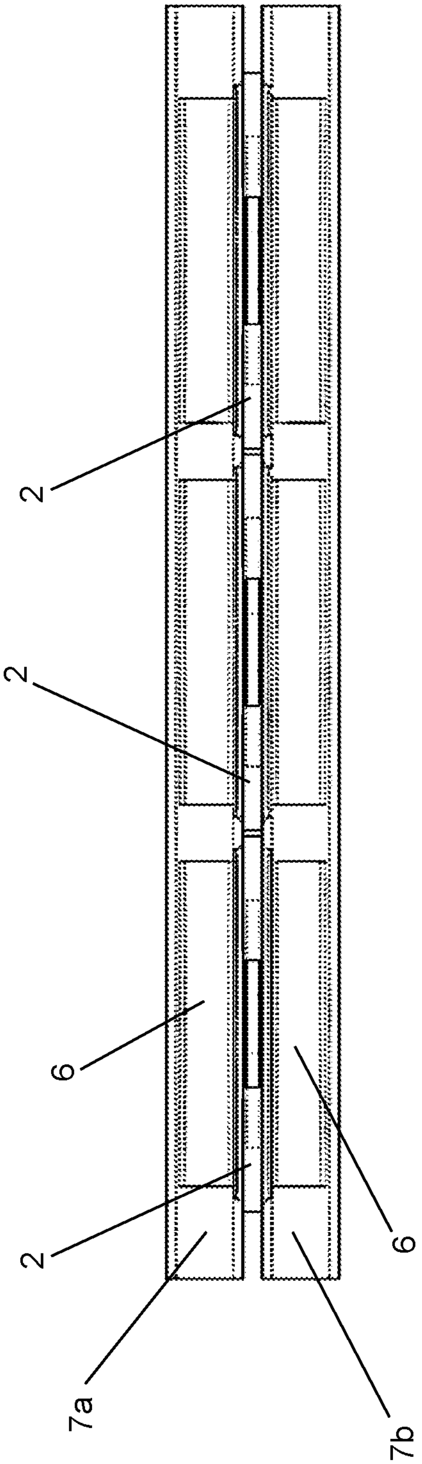
FIG. 8 shows a side view of a semiconductor module assembly without a second housing part.

Furthermore, the semiconductor module assembly 1 in accordance with the exemplary embodiment illustrated in FIG. 5 to FIG. 10 comprises two first housing parts, namely an upper first housing part 7*a* on the top face E of the semiconductor modules 2 and a lower first housing part 7*b* on the bottom face F of the semiconductor modules 2. These two first housing parts 7*a*, 7*b* are manufactured as strand-cast parts and are respectively formed and arranged in the region of the top face E and the bottom face F of the semiconductor module 2 in such a way that they respectively surround the cooling rib structure 6 on the top face E and the bottom face F of the respective semiconductor module 2 and are respectively connected to the semiconductor module 2 in the region of the respective rib 5. For this purpose, on a side of the first housing parts 7*a*, 7*b* facing the cooling rib structure 6, in each case for each of the three cooling rib structures 6 on the top face E and the bottom face F of the semiconductor modules 2, an opening 11 is provided in the respective first housing part 7*a*, 7*b*, a respective cooling rib structure 6 being guided through said opening during the mounting of the first housing parts 7*a*, 7*b*. Between the openings 11, respective webs 12 are formed in the two first housing parts 7*a*, 7*b*, said webs bearing on the ribs 5 of the semiconductor modules 2 (FIG. 7, FIG. 8). Through the upper first housing part 7*a*, an upper cooling channel for guiding a coolant is formed on the top face E of the semiconductor modules 2. Through the lower first housing part 7*b*, a lower cooling channel for guiding a coolant is formed on the bottom face F of the semiconductor modules 2.

Figure 5:
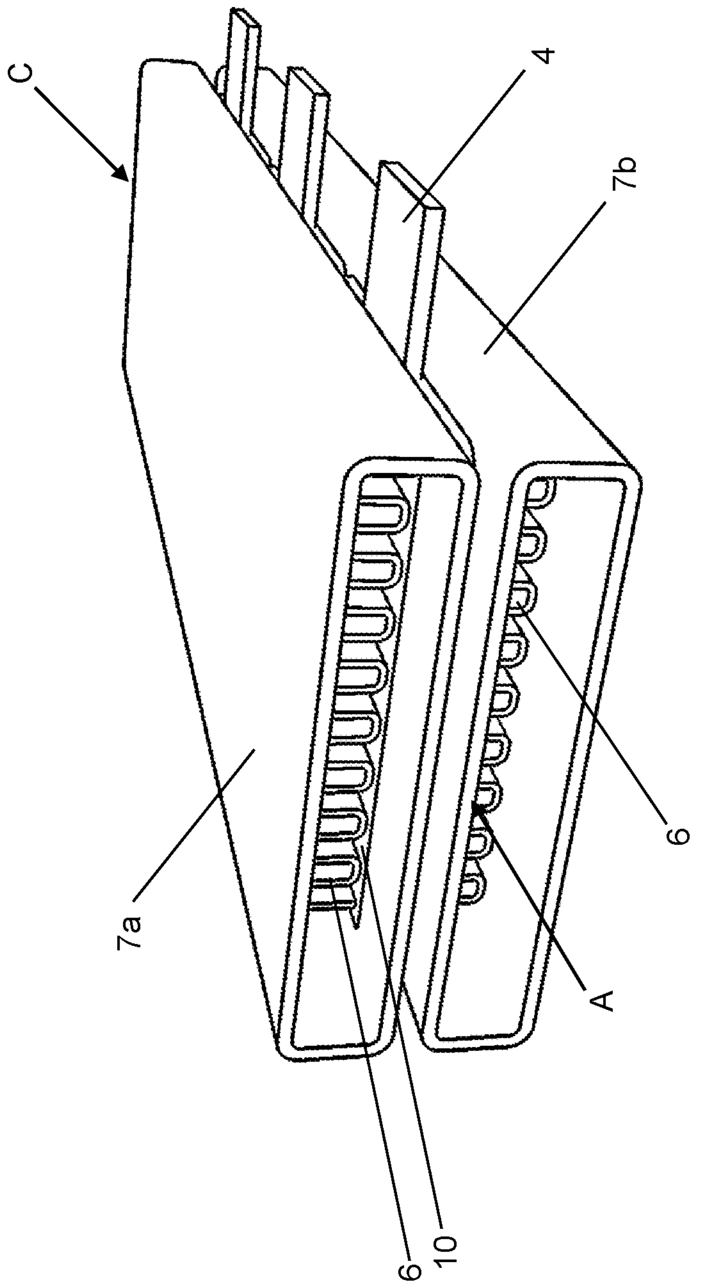
FIG. 5 shows a first perspective view of a semiconductor module assembly without a second housing part.
Figure 6:
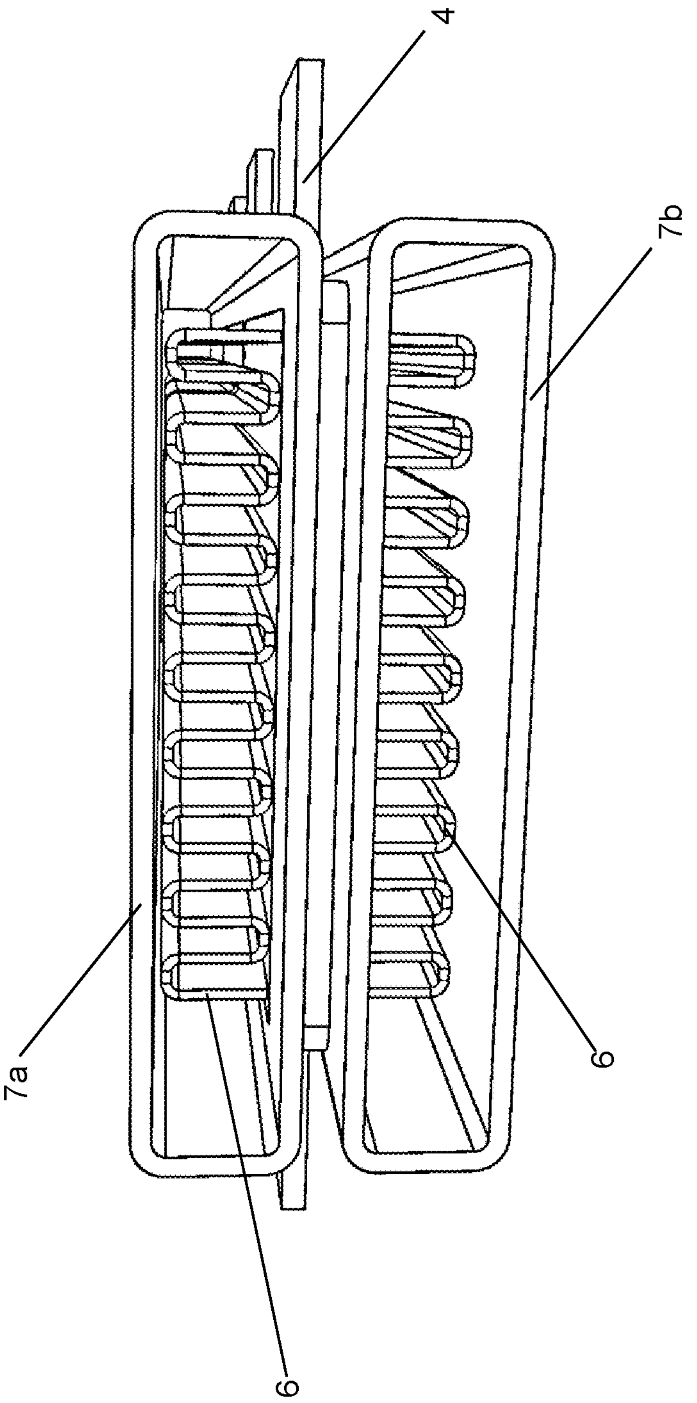
FIG. 6 shows a second perspective view of a semiconductor module assembly without a second housing part.

The two first housing parts 7*a*, 7*b* are in each case embodied as open on a first end face A and a third end face C opposite the first end face A and thus allow access for coolant to the cooling rib structures 6 (FIG. 5, FIG. 6, FIG. 7).

A respective sealing element 8 is arranged between the respective first housing part 7*a*, 7*b*, namely in the region of the webs 12, and the rib 5 (FIG. 7).

Figure 9:
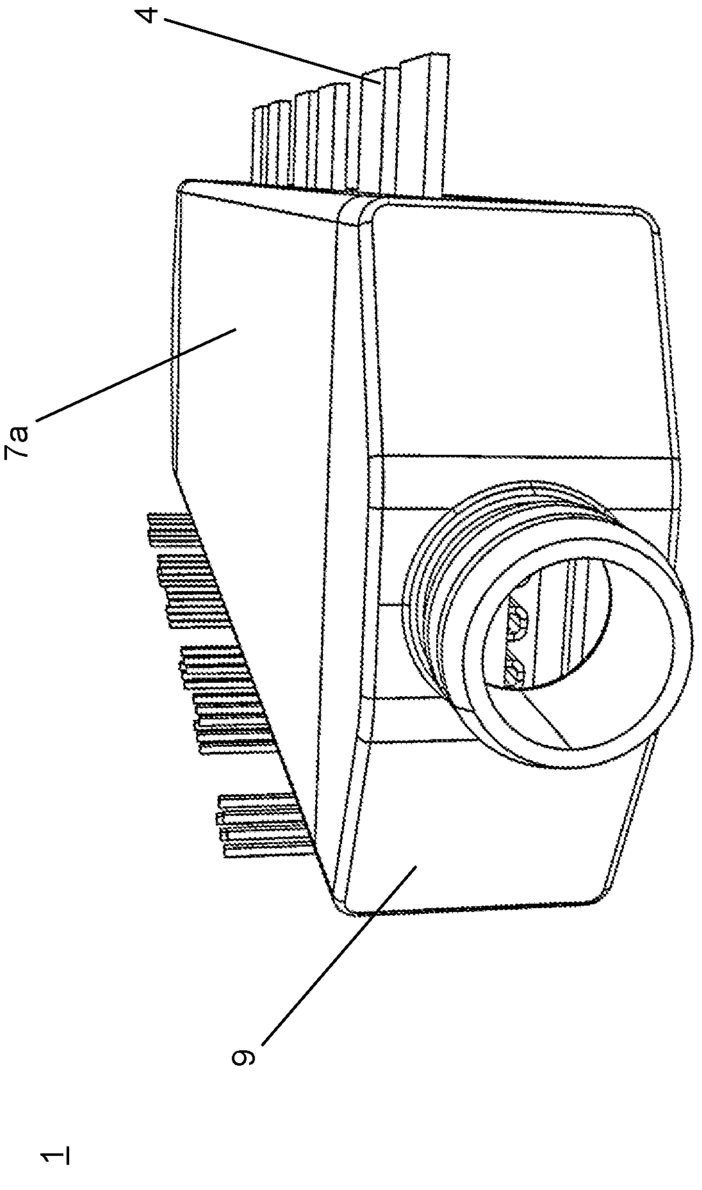
FIG. 9 shows a perspective view of a semiconductor module assembly.
Figure 10:
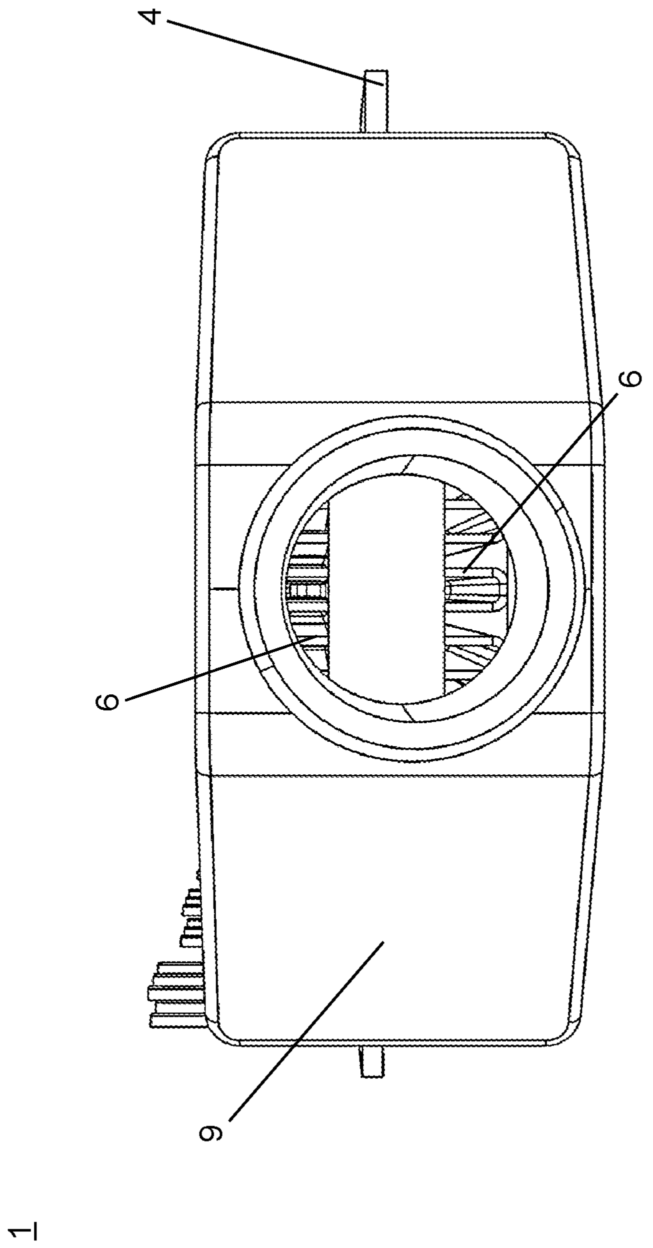
FIG. 10 shows a front view of a semiconductor module assembly.
Figure 11:
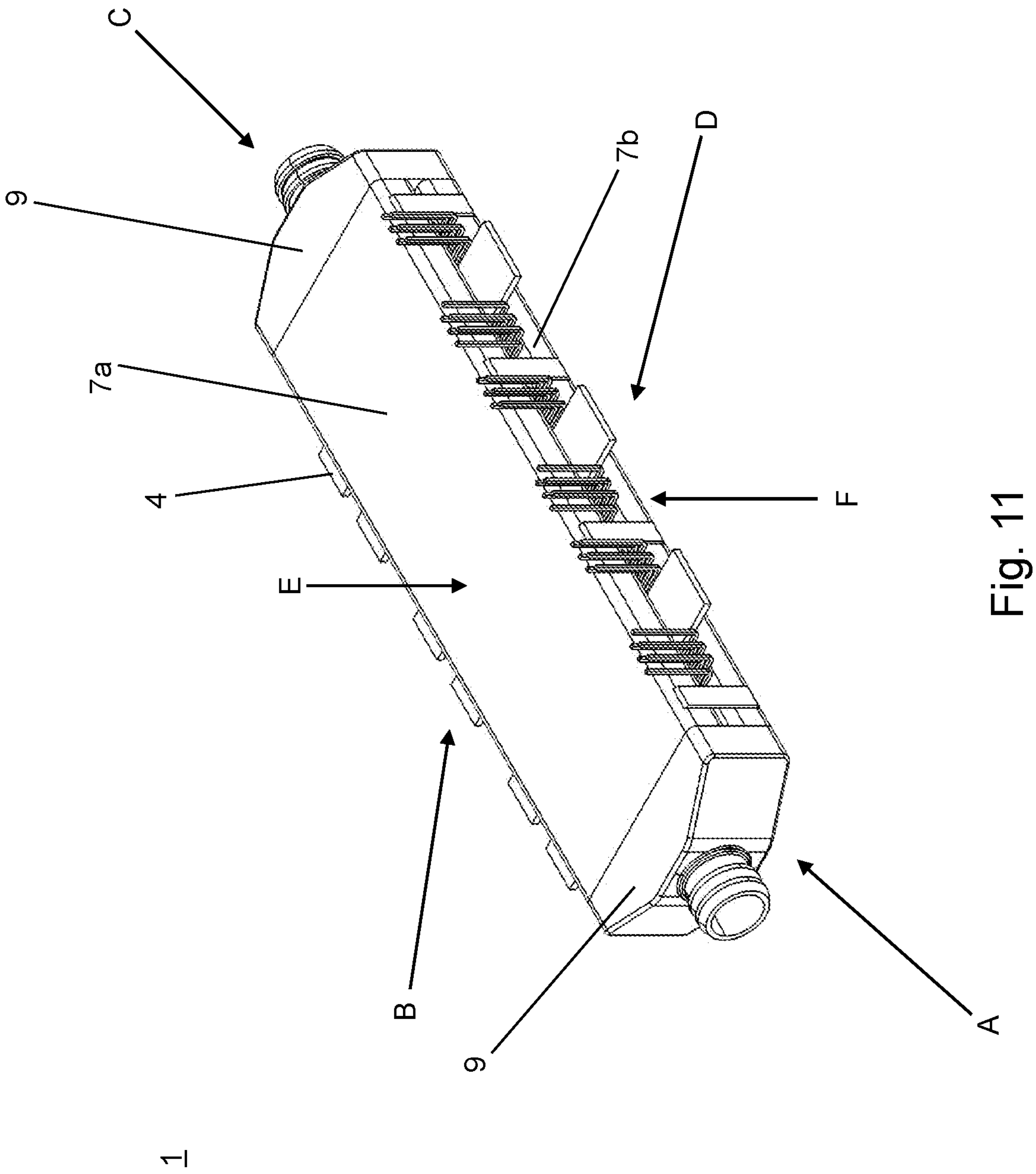
FIG. 11 shows a perspective view of a semiconductor module assembly with connection elements.
Figure 12:
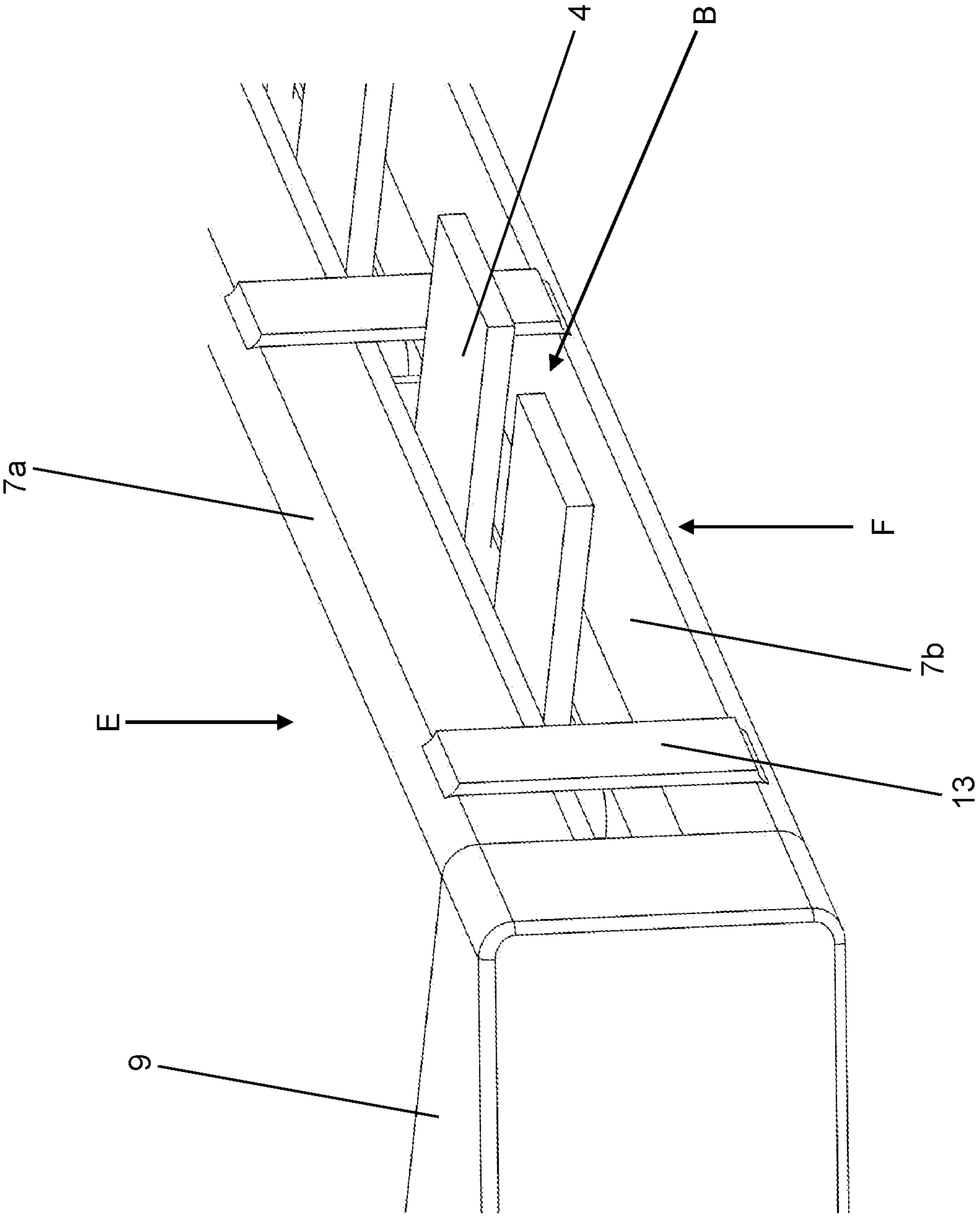
FIG. 12 shows a perspective detail view of a semiconductor module assembly in accordance with FIG. 11.
Figure 13:
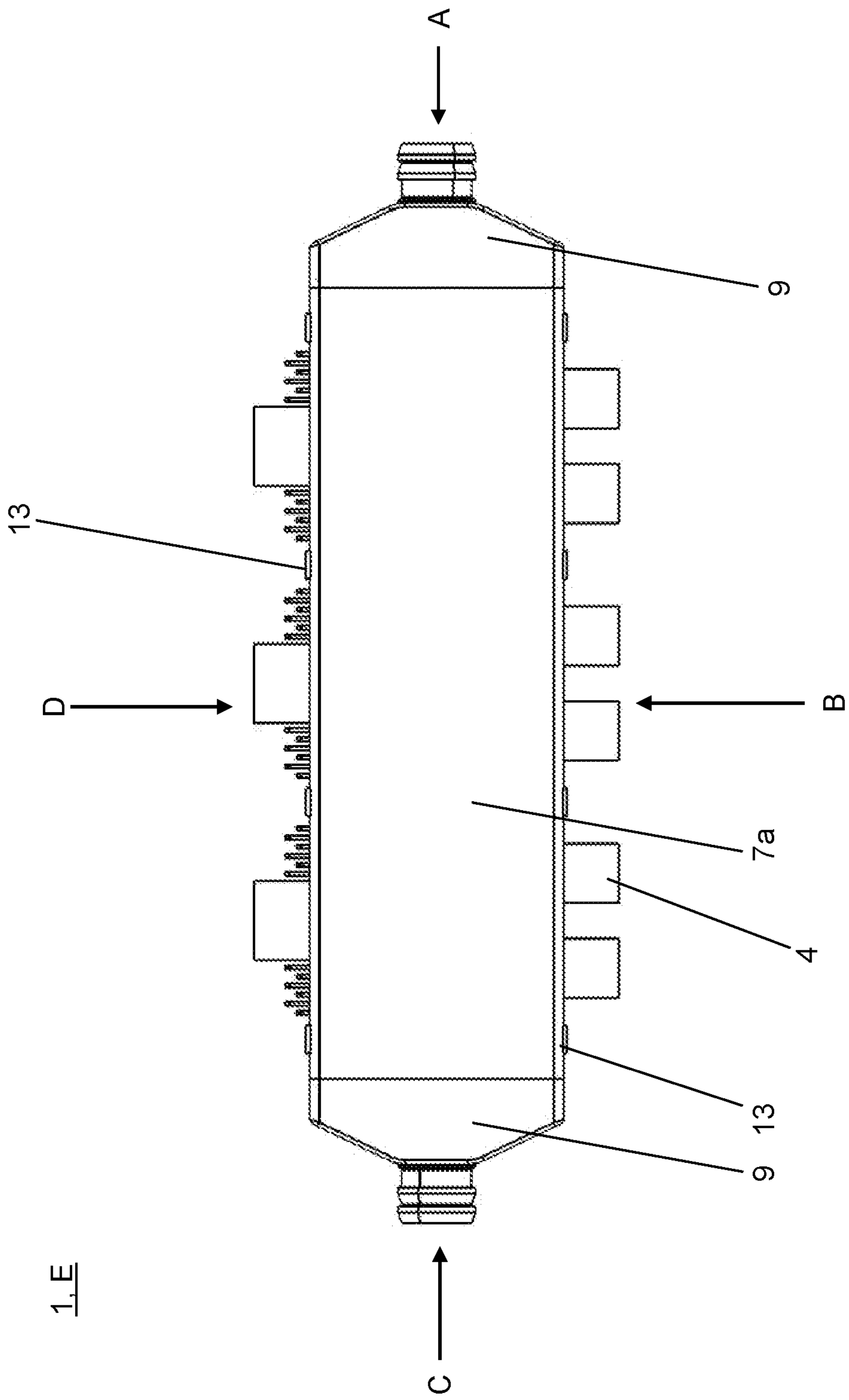
FIG. 13 shows a plan view of the top face of a semiconductor module assembly in accordance with FIG. 11.
Figure 14:
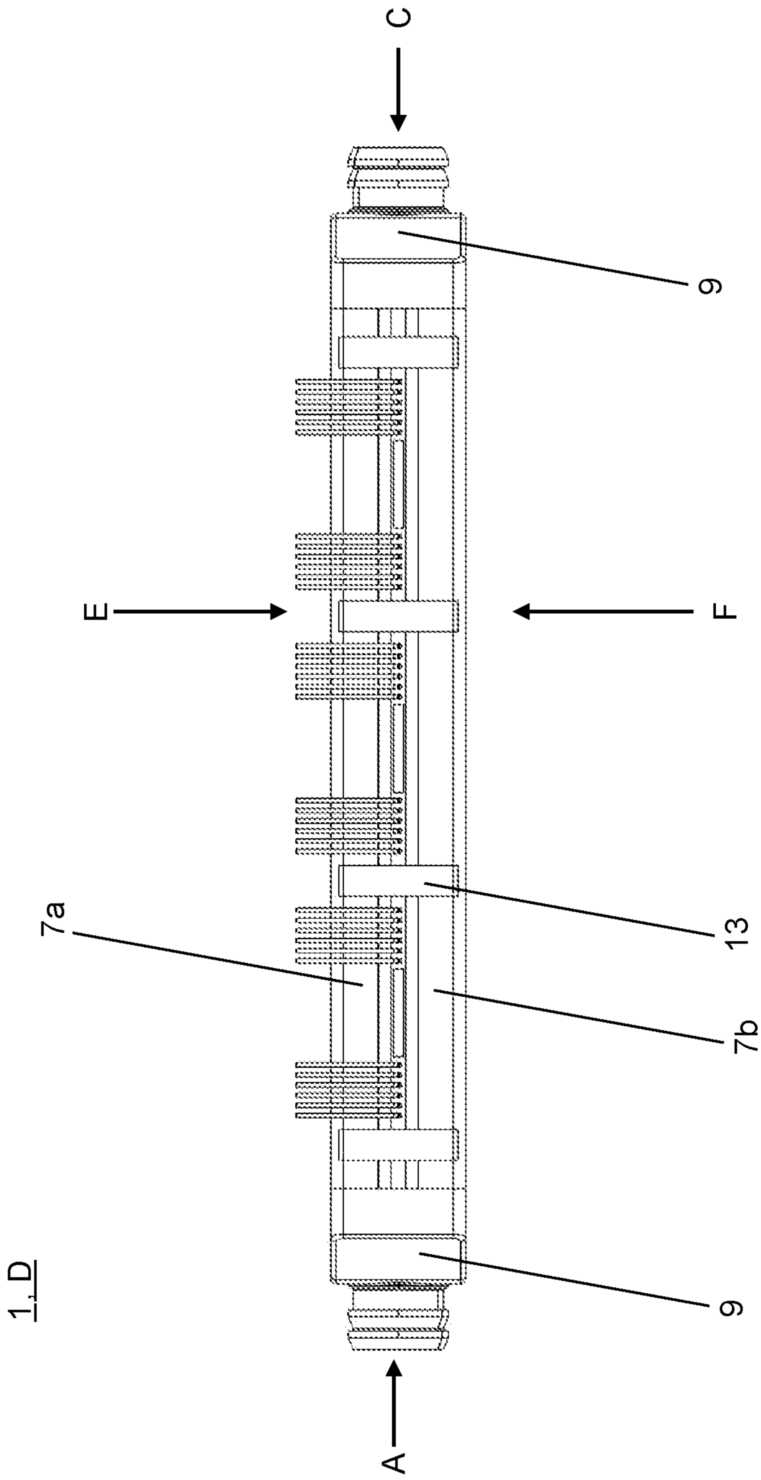
FIG. 14 shows a first side view (end face D) of a semiconductor module assembly in accordance with FIG. 11.
Figure 15:
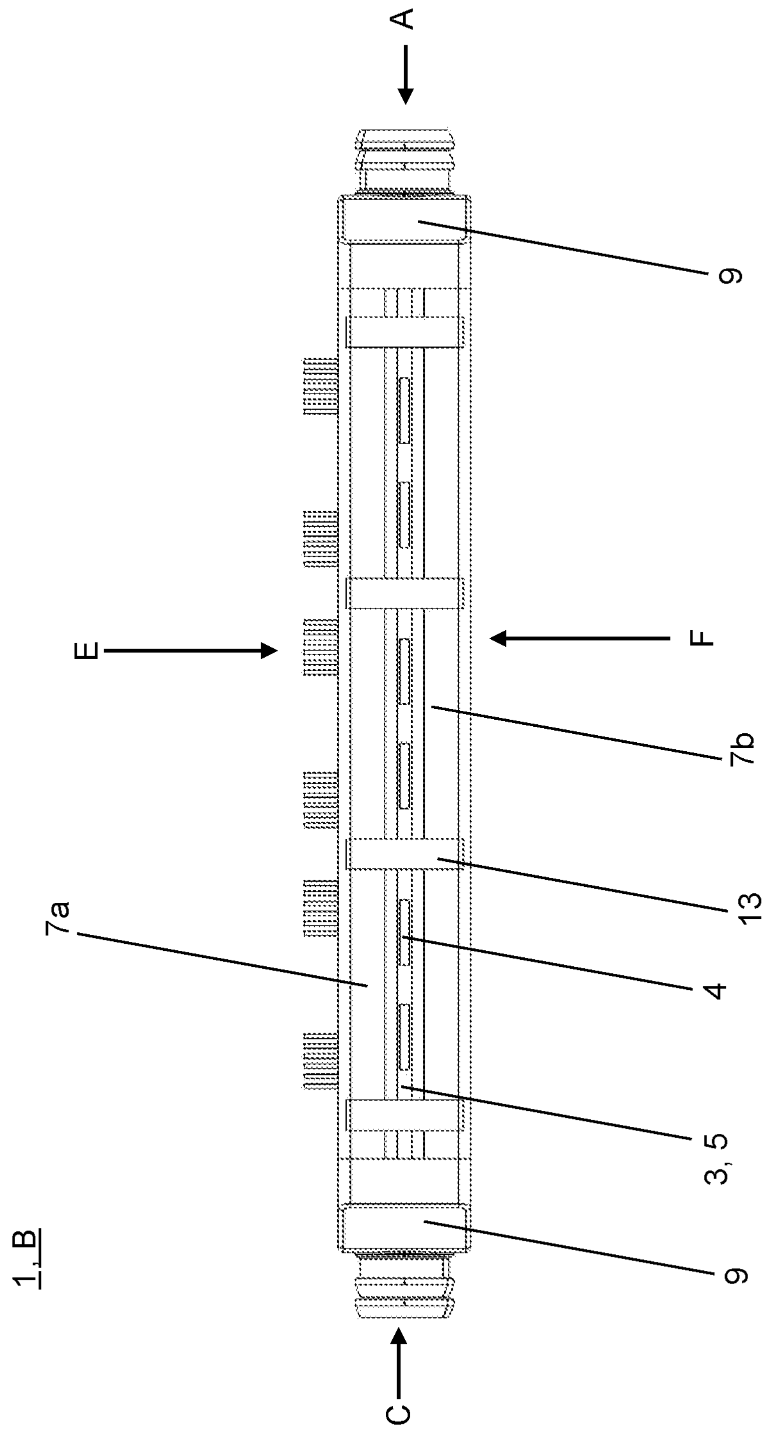
FIG. 15 shows a second side view (end face B) of a semiconductor module assembly in accordance with FIG. 11.
Figure 16:
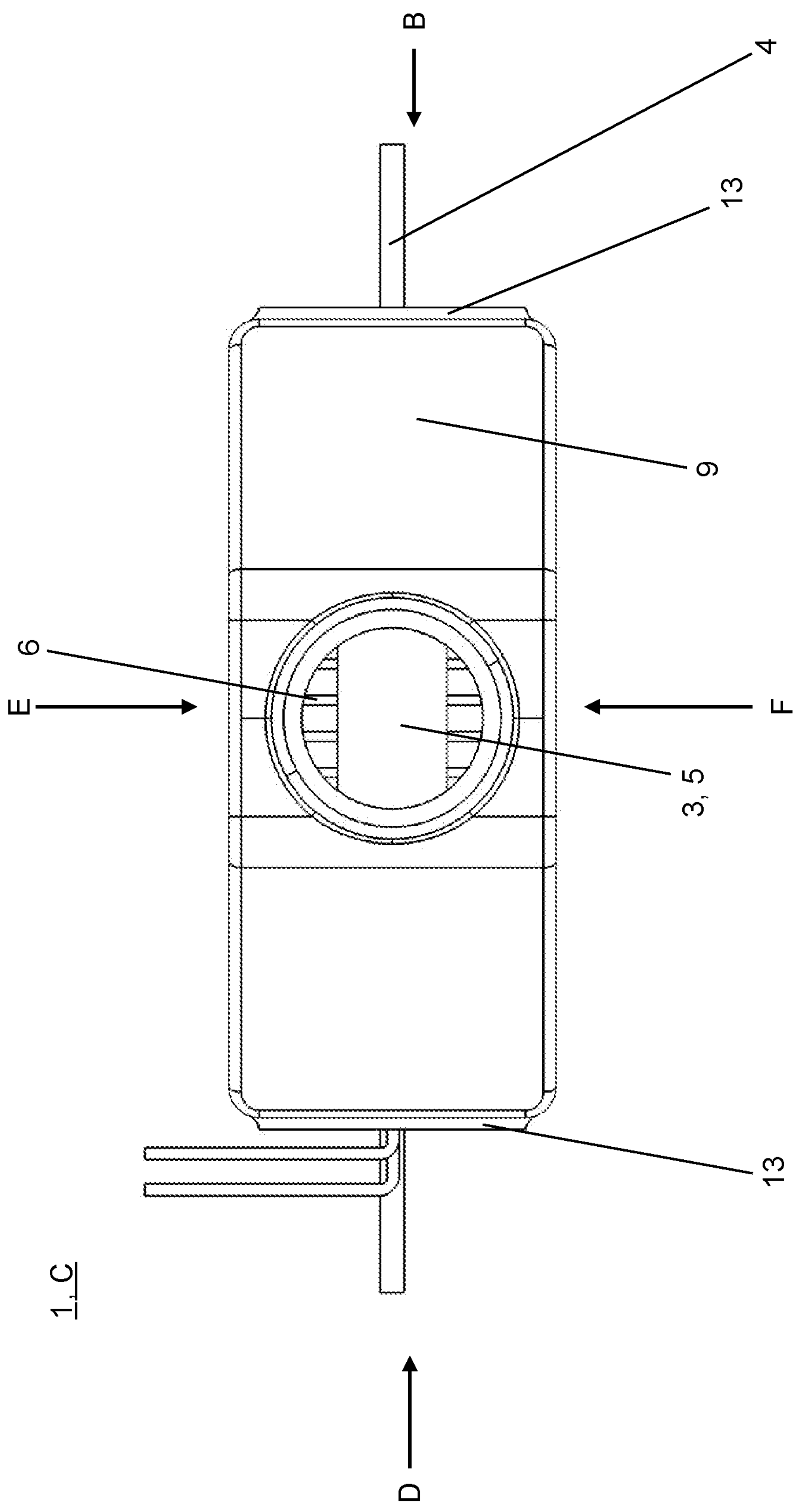
FIG. 16 shows a third side view (end face C) of a semiconductor module assembly in accordance with FIG. 11.
Figure 17:
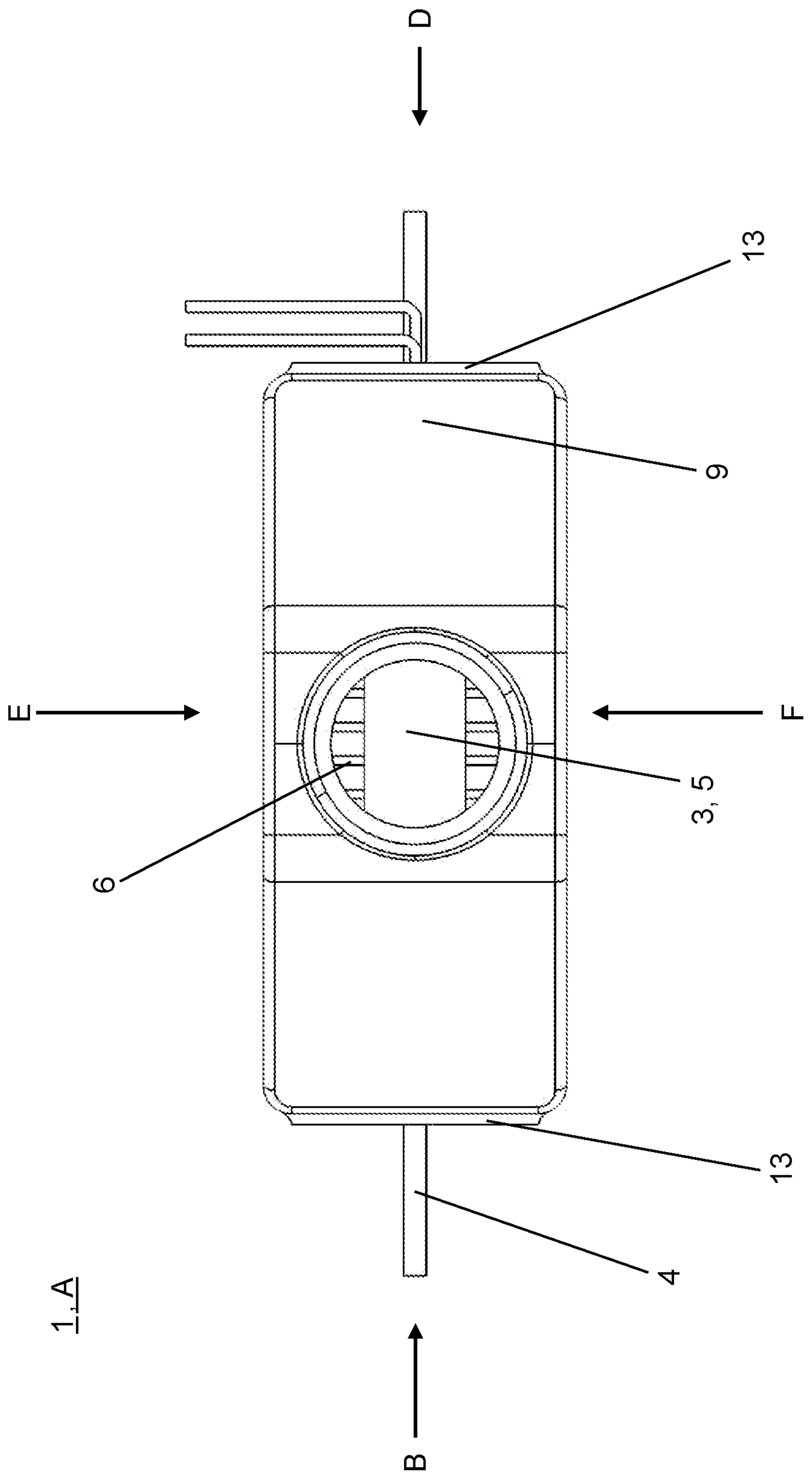
FIG. 17 shows a fourth side view (end face A) of a semiconductor module assembly in accordance with FIG. 11.

Furthermore, the semiconductor module assembly 1 has two second housing parts 9, one of the two second housing parts 9 having a coolant inlet and the other having a coolant outlet (FIG. 9, FIG. 10).

One second housing part 9 on the first end face A and a further second housing part on the third end face C are connected to the two first housing parts 7 (FIG. 9, FIG. 10).

FIG. 11 to FIG. 17 each show a semiconductor module assembly 1 according to FIG. 5 to FIG. 10 with connection elements 13 in different views.

The semiconductor module assembly 1 shown in FIG. 5 to FIG. 17 is a semiconductor module assembly 1 afforded double-sided cooling.

The connection elements 13 fixedly connect the upper first housing part 7*a* and the lower first housing part 7*b* to one another in the region of the second end face B and the fourth end face D.

LIST OF REFERENCE SIGNS

1 Semiconductor module assembly
2 Semiconductor module
3 Molding compound
4 Electrical terminals
5 Rib
6 Cooling rib structure
7*a* Upper first housing part
7*b* Lower first housing part
8 Sealing element
9 Second housing part
10 Cooling plate
11 Opening
12 Web
13 Connection element
A First end face of the semiconductor module
B Second end face of the semiconductor module
C Third end face of the semiconductor module
D Fourth end face of the semiconductor module
E Top face of the semiconductor module
F Bottom face of the semiconductor module

What is claimed is:

1. A semiconductor module assembly comprising at least one semiconductor module having at least one semiconductor chip, which is encapsulated substantially parallelepipedally by a molding compound and has a plurality of electrical terminals electrically connected to the at least one semiconductor chip, the plurality of electrical terminals projecting from the molding compound, a rib running peripherally along lateral end faces of the at least one semiconductor module, said rib being formed by the molding compound, at least one cooling plate on at least a top face and/or a bottom face of the at least one semiconductor module, the at least one cooling plate being enclosed by molding in the molding compound, but at least partly uncovered by the molding compound, at least one cooling rib structure fixedly connected to the at least one cooling plate on the top face and/or the bottom face of the at least one semiconductor module, at least one first housing part, the at least one first housing part surrounding the at least one cooling rib structure and connected to the at least one semiconductor module at the rib, the at least one first housing part being open on a first end face of the lateral end faces and a second end face of the lateral end faces opposite the first end face, thereby allowing access for coolant to the at least one cooling rib structure, a sealing element arranged between the at least one first housing part and the rib, two second housing parts, one second housing part being connected to the at least one first housing part on the first end face and a further second housing part being connected to the at least one first housing part on the second end face, wherein the two second housing parts combine to include a coolant inlet and a coolant outlet at the first and second end faces;

wherein the at least one first housing part has at least two first housing parts, an upper first housing part being arranged on the top face of the at least one semiconductor module and a lower first housing part being arranged on the bottom face of the at least one semiconductor module, the upper first housing part and the lower first housing part being fixedly connected via at least one connection element in a region of at least one of the lateral end faces of the at least one semiconductor module;

wherein the at least one semiconductor module assembly is provided in a prestressed state between the at least one first housing part and the at least one second housing part and held in the prestressed state by the at least one connection element.

2. The semiconductor module assembly as claimed in claim 1, wherein the at least one cooling plate is a metallic material.

3. The semiconductor module assembly as claimed in claim 2, wherein the at least one cooling plate is copper.

4. The semiconductor module assembly as claimed in claim 1, wherein the at least one first housing part is a strand-cast part.

5. The semiconductor module assembly as claimed in claim 1, wherein the at least one cooling plate extends across the top face and/or the bottom face of the at least one semiconductor module as far as the rib on the lateral end faces of the at least one semiconductor module.

6. The semiconductor module assembly as claimed in claim 1, wherein the at least one connection element is a metallic material.

7. The semiconductor module assembly as claimed in claim 6, wherein the at least one connection element is formed in strip-shaped fashion.

8. The semiconductor module assembly of claim 1, wherein the lateral end faces extend between the top face and the bottom face.

9. The semiconductor module assembly of claim 8, wherein the rib extends fully around all of the lateral end faces.

10. The semiconductor module assembly of claim 1, wherein the at least one first housing part includes an opening through which the at least one cooling rib structure contact the at least one cooling plate.

11. The semiconductor module assembly of claim 10, wherein the at least one first housing part includes a web surrounding the opening, wherein the web at least partially overlaps the rib.

12. The semiconductor module assembly of claim 1, wherein the at least one first housing part includes an upper first housing part and a lower first housing part, wherein the at least one semiconductor module comprises more than one semiconductor module that is arranged end-to-end within a single upper first housing part and lower first housing part.

13. The semiconductor module assembly of claim 12, wherein the one second housing part at the first end face and the further second housing part at the second end face are attached at opposite ends of the upper first housing part and the lower first housing part.

14. The semiconductor module assembly of claim 12, wherein each semiconductor module of the more than one semiconductor module has dedicated cooling ribs, wherein the cooling ribs are aligned to define a continuous path for the coolant entering and exiting through the open first and second end faces.

15. The semiconductor module assembly of claim 12, wherein the upper first housing part and the lower first housing part each include multiple openings through which the at least one cooling rib structure and the at least one cooling plate of respective semiconductor modules of the more than one semiconductor module contact each other.

16. The semiconductor module assembly of claim 12, wherein one of the two second housing parts defines the inlet and the other of the two second housing parts defines the outlet, where the same inlet and outlet are provided for each of the at least one semiconductor modules.

17. The semiconductor module assembly of claim 1, wherein the at least one connector element comprises multiple connector elements that are provided on opposite lateral end faces, wherein the opposite lateral end faces on which the multiple connector elements are provided are different than the open first and second end faces.

18. A method for producing a semiconductor module assembly, wherein the semiconductor module assembly comprises:

at least one semiconductor module having at least one semiconductor chip, which is encapsulated substantially parallelepipedally by a molding compound and has a plurality of electrical terminals electrically connected to the at least one semiconductor chip, the plurality of electrical terminals projecting from the molding compound, a rib running peripherally along lateral end faces of the at least one semiconductor module, said rib being formed by the molding compound, at least one cooling plate on at least a top face and/or a bottom face of the at least one semiconductor module, the at least one cooling plate being enclosed by molding in the molding compound, but at least partly uncovered by the molding compound, at least one cooling rib structure fixedly connected to the at least one cooling plate on the top face and/or the bottom face of the at least one semiconductor module, at least one first housing part, the at least one first housing part surrounding the at least one cooling rib structure and connected to the at least one semiconductor module at the rib, the at least one first housing part being open on a first end face of the lateral end faces and a second end face of the lateral end faces opposite the first end face, thereby allowing access for coolant to the at least one cooling rib structure, a sealing element arranged between the at least one first housing part and the rib, two second housing parts, one second housing part being connected to the at least one first housing part on the first end face and a further second housing part being connected to the at least one first housing part on the second end face, wherein the two second housing parts combine to include a coolant inlet and a coolant outlet at the first and second end faces;

wherein the at least one first housing part has at least two first housing parts, an upper first housing part being arranged on the top face of the at least one semiconductor module and a lower first housing part being arranged on the bottom face of the at least one semiconductor module, the upper first housing part and the lower first housing part being fixedly connected via at least one connection element in a region of at least one of the lateral end faces of the at least one semiconductor module;

the method comprising at least the following steps:

positioning the semiconductor module assembly without mounting the two second housing parts in a device, applying a prestressing force to the semiconductor module assembly in direction of the top face and/or the bottom face of the at least one semiconductor module, positioning the at least one connection element in the region of the at least one of the lateral end faces so that the at least one connection element bears partly against the upper first housing part and partly against the lower first housing part, cohesively connecting the at least one connection element to the upper first housing part and to the lower first housing part, and releasing the prestressing force.

19. The method as claimed in claim 18, wherein the cohesively connecting the at least one connection element to the upper first housing part and to the lower first housing part is performed by laser welding.

* * * * *